United States Patent [19]

Takeda

[11] Patent Number: 4,649,098

[45] Date of Patent: Mar. 10, 1987

[54] IMAGE RECORDING PROCESS USING BOTH SILVER HALIDE AND VINYL MONOMERS

[75] Inventor: Keiji Takeda, Kanagawa, Japan

[73] Assignee: Fuji Photo Film Co., Ltd., Japan

[21] Appl. No.: 778,653

[22] Filed: Sep. 23, 1985

[30] Foreign Application Priority Data

Sep. 21, 1984 [JP] Japan .................. 59-198196

[51] Int. Cl.⁴ ............................... G03C 1/76
[52] U.S. Cl. .................... 430/270; 430/264; 430/281; 430/394; 430/406; 430/434
[58] Field of Search ............ 430/281, 394, 406, 434, 430/270, 264

[56] References Cited

U.S. PATENT DOCUMENTS 3,029,145  4/1962  Dumers et al. ............... 430/444
3,241,962  3/1966  Sincius ........................ 430/281
3,345,164  10/1967  Cohen et al. ................. 430/251
4,287,290  9/1981  Mizuno et al. ............... 430/204
4,560,637  12/1985  Meada et al. ................ 430/281

Primary Examiner—Jack P. Brammer
Attorney, Agent, or Firm—Sughrue, Mion, Zinn, Macpeak & Seas

[57] ABSTRACT

An image recording process and image recording material are described, said material comprising a support having provided thereon at least one light-sensitive layer containing in a binder a light-sensitive silver halide, a polymrizable vinyl monomer, a photopolymerization initiator and a reducing agent which has a function as a developing agent for silver halide and a function as a polymerization inhibitor for the polymerizable vinyl monomer, but loses the function as a polymerization inhibitor after development of silver halide, and said process comprising imagewise exposure, heating and uniform light exposure.

19 Claims, 11 Drawing Figures

IMAGE RECORDING PROCESS USING BOTH SILVER HALIDE AND VINYL MONOMERS

FIELD OF THE INVENTION

The present invention relates to a process of recording images at high sensitivity by a polymerization reaction using silver halide as a light-sensor and to a material for using in such a process. Particularly, it relates to a process for recording by dry processing and a material for using in such a process.

BACKGROUND OF THE INVENTION

Many photopolymerization reactions utilizing an organic dye as a light sensitizer (initiator) and polymer image recording processes based on the photopolymerization reaction are well known, but the sensitivity thereof is usually as low as ISO $10^{-3}$ or less, which is very inferior to that of silver halide photographic materials. Although the polymer images obtained by photopolymerization have various useful properties in utilization, which are not provided by silver halide photographic materials, use thereof is restricted due to such limited sensitivity.

Further, in the case of forming visible images, particularly for use as hard copies, the use of the photopolymerization image recording materials is very restricted because of having such low sensitivity, in spite of having the great advantage of not using silver, which is an expensive and rare resource. Accordingly, if the polymer imaging material can be formed to have a high sensitivity equal to that of silver halide, it would become possible not only to greatly expand the extent of utilization of the field of image formation based on photopolymerization, for example, for printing plates, photoresists, etc.; but also to greatly expand the use thereof as inexpensive hard copy materials.

Hitherto, as high sensitivity processes for forming a polymer image, various attempts wherein polymerization is carried out using silver halide as a light sensor by utilizing a high amplification rate of it in a development stage have been done.

For example, there are: (1) a process wherein a polymerization reaction is caused by a radical formed in the reducing agent oxidized in the development step of silver halide, as described in Japanese Patent Applications (OPI) Nos. 78153/83, 169143/83, and 174947/83 (the term "OPI" as used herein referring to a "published unexamined Japanese patent application"); (2) a process wherein a polymerization reaction is caused by a radical formed from perioxide by a redox reaction between the silver image obtained by development of silver halide and the peroxide, as described in Japanese Patent Publication No. 18862/66, corresponding to U.S. Pat. No. 3,241,962 (3) a process wherein a polymerization reaction is caused by a radical formed from peroxide by a redox reaction between silver ion which remains in the unexposed area and dissolved therefrom after development of silver halide and the peroxide as described in Japanese Patent Publication No. 2657/64, corresponding to U.S. Pat. No. 3,345,164; (4) a process wherein a polymerization reaction is caused by a radical formed from peroxide by a redox reaction between iron (I) salt remaining in the unexposed area and the peroxide after development of silver halide with the iron (I) salt, as described in U.S. Pat. No. 3,029,145; and (5) a process wherein a polymerization reaction is directly caused by the reducing agent remaining in the unexposed area after silver halide is developed, as described in Japanese Patent Application (OPI) No. 149939/80, corresponding to U.S. Pat. No. 4,287,290.

These processes are those wherein a radical is formed directly or by a subsequent reaction, using any of raw materials taking part in the development step of silver halide (silver halide, reducing agent) and products (silver image, oxidation product of reducing agent). In these causes, it is supposed that the polymer image is formed in a sensitivity near that of silver halide. However, all of them require wet processings for carrying out development of silver halide and the step of polymerizing by radical formation, and the processes using peroxide have a fault of causing great deterioration of the recording material, or the occurrence of fog due to polymerization in the dark by radicals formed by decomposition of the peroxide. Further, they generally have a fault in that the polymerization reaction requires a long time.

SUMMARY OF THE INVENTION

Accordingly, it has been desired to record the polymer image with high sensitivity which is equal to that of the silver halide photographic materials, and to carry out it by a simple process, and particularly a dry process, within a short time.

As a result of extensive studies, and on the basis of a entirely novel idea, the present inventors have solved the problems of the art as described above by providing image recording processes (1) and (2) and image recording materials (3) and (4) as described below.

(1) An image recording process which comprises forming a latent image by imagewise exposure of light-sensitive silver halide, developing the latent image with a reducing agent which has a function as a developing agent for silver halide and a function as a polymerization inhibitor for a polymerizable vinyl monomer, but loses the function as a polymerization inhibitor after development of silver halide, to result in a state that polymerization of the polymerizable vinyl monomer is inhibited by the residual reducing agent, and thereafter conducting substantially uniform light exposure to cause photopolymerization of the polymerizable vinyl monomer in the part where said reducing agent is not present, in the presence of a photopolymerization initiator, whereby a polymer image corresponding to said latent image is formed.

(2) An image recording process which comprises forming a latent image by imagewise exposure of light-sensitive silver halide, developing the latent image with a reducing agent which has a function as a developing agent for silver halide and a function as a polymerization inhibitor for a polymerizable vinyl monomer, but loses the function as a polymerization inhibitor after development of silver halide, to result in a state that polymerization of the polymerizable vinyl monomer is inhibited by the residual reducing agent, conducting substantially uniform light exposure to cause photopolymerization of the polymerizable vinyl monomer in the part where said reducing agent is not present, in a presence of a photopolymerization initiator, thereby forming a polymer image, and thereafter substantially uniformly heating in a state of contact of the layer having said polymer image and a layer containing a dye capable of being bleached with said polymerizable vinyl monomer, or containing a dye precursor which forms a dye capable of being bleached with said polymerizable vinyl monomer to bleach said dye or the dye formed from said dye precursor with the unpolymerized polymerizable vinyl monomer, whereby a dye image corresponding to said latent image is formed.

(3) An image recording material comprising a support having provided thereon at least one light-sensitive layer containing in a binder a light-sensitive silver halide, a polymerizable vinyl monomer, a photopolymerization initiator and a reducing agent which has a function as a developing agent for silver halide and a function as a polymerization inhibitor for a polymerizable vinyl monomer, but loses the function as a polymerization inhibitor after development of silver halide, wherein a photopolymerizable vinyl monomer and a photopolymerization initiator are contained in the layer containing the silver halide and the reducing agent, or in an another layer on the same support, or composing a separate layer on a different support.

Figure 1A:
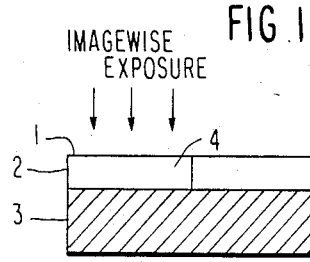
FIG. 1(A) shows the state of imagewise exposing the silver halide light-sensitive material, (B) shows the state of developing it by heating, (C) shows the state of intimately contacting the developed silver halide light-sensitive material with the photopolymerizable material and heating the assembly, and (D) shows the state of uniformly exposing the photopolymerizable material to imagewise form a polymer.
Figure 1B:
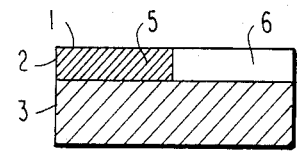
FIG. 1 illustrates an embodiment of the image forming process of the present invention.
Figure 1C:
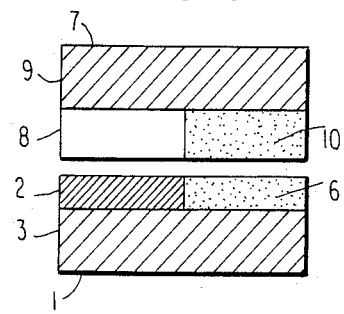
Figure 1D:
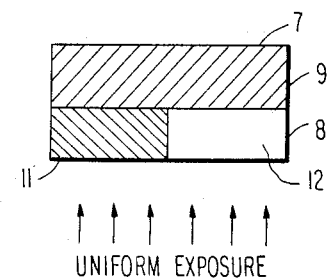

In the drawings, the numerals are as follows: 1 indicates a silver halide light-sensitive material; 2 and 15 indicate a silver halide light-sensitive layer; 3, 9, 16, 23, and 30 indicate a support; 4, 17, and 24 indicate a latent image forming part; 5, 18, and 25 indicate a silver image forming part; 6, 19, and 26 indicate an unexposed part; 7 indicates a photopolymerization material; 8 and 14 indicate a photopolymerizable layer; 10 and 12 indicate a polymerization inhibiting part; 11, 20, and 27 indicate a polymer image; 13 indicates a multilayer monosheet type image recording material, 21 indicates a monolayer monosheet type image recording layer, 22 indicates a silver halide and monomer containing layer; 28 indicates a heat-sensitive recording material; 29 indicates a heat-sensitive layer; 31 indicates a dye image; and 32 indicates a bleached dye part.

DETAILED DESCRIPTION OF THE INVENTION

The image recording according to the present invention is based on a novel principle and is quite different from the known processes of forming images by a polymerization reaction using silver halide. Namely, in the prior processes, the raw material or the product imagewise formed in the step of developing silver halide is utilized for directly or indirectly forming radicals by a reaction in the dark in order for polymerization to take place. On the contrary, in the present invention, the reducing agent is material which is imagewise consumed in the step of developing silver halide and a polymerization reaction is imagewise inhibited by the residual reducing agent, and thus photopolymerization is caused in the area the polymerization reaction is not inhibiting by uniformly injecting external light energy to form a polymer image (polymerization image).

Accordingly, the following characteristics which could not be obtained in the prior processes are provided according to the present invention. Firstly, when a compound having a great function of inhibiting polymerization, namely, the function of capturing free radicals, is used as the reducing agent, the amount of silver halide necessary for imagewise oxidizing the reducing agent to provide a state of being capable of polymerization becomes small, because the polymerization can be inhibited by using only a very small amount of the reducing agent, and image recording can be carried out with high sensitivity, because the reducing agent in a very small amount can be oxidized in a high amplification rate by silver halide. Secondly, since the polymerization reaction is caused by injecting sufficient external energy in the form of light energy, namely, light amplification is carried out, the polymer image can be formed at a high polymerization rate, namely, a high amplification rate, and the time necessary to carry out polymerization becomes shorter as increasing intensity of energy is used for uniform exposure, whereby it becomes very shortened as compared with the prior case of polymerizing with radicals formed by a reaction in the dark.

Further, the development of silver halide can be carried out simply by heating if the reducing agent is incorporated in the silver halide layer, and the photopolymerization caused by uniform exposure takes place in the dry film, and thus the polymer can be imagewise formed by a completely dry process without using any processing solution. Of course, if desired, development may be carried out by supplying water or an aqueous alkali solution, etc. Alternatively, the development can be carried out by supplying a reducing agent in the state of an aqueous solution without incorporating it in the silver halide layer, which is also within the scope of the present invention.

Concerning the steps of imagewise forming the polymer, preferred embodiments of the present invention are illustrated with reference to drawings in the following description.

FIG. 1 illustrates an example of forming an image by means of two sheets wherein a layer containing silver halide and a reducing agent and a layer containing a photopolymerizable composition are provided on different support, respectively. In (A), a silver halide light-sensitive material 1 which comprises a support 3 havng provided thereon a light-sensitive layer 2 containing light-sensitive silver halide and a reducing agent is imagewise exposed to light to form a latent image 4. (B) shows the state of developing it with heating. The latent image is developed to form a silver image 5, and, at the same time, the reducing agent is oxidized. In the unexposed area 6, the reducing agent remains unchanged as it is. Then, in (C), it is brought in contact with a photopolymerizable material 7 which comprises a support 9 having provided thereon a photopolymerizable composition 8 comprising a polymerizable vinyl monomer and a photopolymerization initiator. When they are heated, the reducing agent remaining in the unexposed area 6 is transferred by diffusing into the area 10 of the photopolymerizable layer, so that the area is in the state of inhibiting polymerization. In (D), after the photopolymerizable material is separated, it was uniformly exposed to light to cause photopolymerization in the part corresponding to the imagewise exposed area, by which a polymer image 11 is formed. In the part 12 corresponding to the unexposed area, the polymer is not formed, because the polymerization is inhibited by the reducing agent.

In the thermal development in (B), when oxygen in the air inhibits the development, the development can be carried out by heating the light-sensitive layer in close contact with a plastic film which is substantially non-permeable to air, or by heating through a heat roller (with intercepting the air by the roller).

In the case that the silver halide is developed at room temperature, it is possible to carry out directly the transfer of the reducing agent as in (C) after allowing it to stand at room temperature for a specified time after exposure. In the case that the photopolymerization is inhibited or retarded by oxygen in the air, the polymer image can be obtained by conducting uniform exposure in (D) without separating both sheets after step (C).

Additionally, thermal development of silver halide in (B) can be omitted, by which it is possible to carry out development of silver halide and transfer of unoxidized reducing agent at the same time (or successively) by a single heating operation by conducting the step (C) directly. It is possible to provide an optimum process for a particular intended use by selecting from the above described various embodiments, which depends upon the kind and concentration of the reducing agent or the development accelerator, constitution of the photopolymerizable layer (kind of the photopolymerizable composition or the binder, concentration, and dispersed state), etc.

Figure 2A:
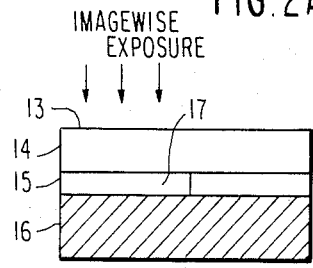
FIG. 2(A) shows the state of imagewise exposing the image recording material, (B) shows the state of heating the same, and (C) shows the state of uniformly light exposing the same, to imagewise form a polymer.
Figure 2B:
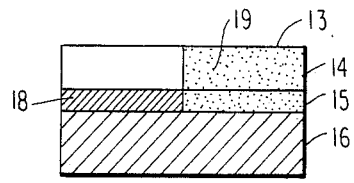
FIG. 2 illustrates an embodiment of the image recording material of the present invention and the process of recording an image using the same.
Figure 2C:
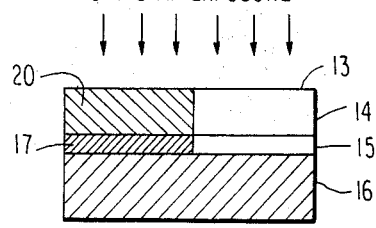

FIG. 2 illustrates an embodiment of a multilayer mono-sheet type image recording material of the present invention and an image recording process using the same. FIG. 2(A) shows the state of imagewise exposing a recording material 13 which comprises a support 16 having provided thereon a light-sensitive layer 15 containing silver halide and a reducing agent and a photopolymerizable layer 14 containing a photopolymerizable composition in layers, wherein a latent image 17 is formed. When it is heated in (B), silver halide is developed to form a silver image 18 and, at the same time, the unoxidized reducing agent 19 diffuses in the photopolymerizable layer. When it is uniformly exposed in (C), photopolymerization is caused in the imagewise exposed area to form a polymer image 20, but polymer is not formed in the unexposed area, because the polymerization is inhibited by the reducing agent. The order of the light-sensitive layer and the photopolymerizable layer in the recording material may be the reverse of the above described case, if desired.

Figure 3A:
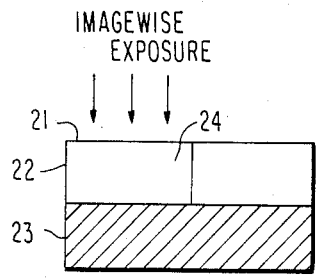
FIG. 3(A) shows the state of imagewise exposing the image recording material, (B) shows the state of heating the same, and (C) shows the state of uniformly light exposing the same to imagewise form a polymer.
Figure 3B:
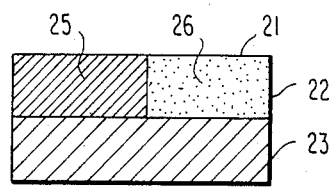
FIG. 3 illustrates another embodiment of the image recording material of the present invention and the process for recording an image using the same.
Figure 3C:
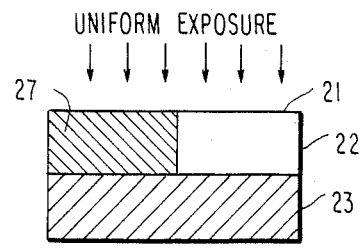

FIG. 3 illustrates an embodiment of a single layer mono-sheet type image recording material and an image recording process using the same, which is different from that shown in FIG. 2. FIG. 3(A) shows the state of imagewise exposing a recording material 21 which comprises a support 23 having provided thereon a light-sensitive layer 22 containing silver halide, a reducing agent and a photopolymerizable composition, wherein a latent image 24 is formed, and (B) shows the state of developing under heating or at room temperature, wherein a silver image 25 and a reducing agent image 26 of the reversal image are formed. When it is uniformly exposed in (C), photopolymerization is caused in the imagewise exposed area to form a polymer image 27 overlapping with the silver image, but the polymer is not formed in the unexposed area, because the polymerization is inhibited by the reducing agent.

In FIGS. 2 and 3, in case that thermal development of silver halide and photopolymerization by uniform exposure are inhibited by oxygen in the air, it is preferred to bring a plastic film which is substantially non-permeable to air therethrough in close contact with the light-sensitive layer or to previously provide a layer which is substantially non-permeable to air there through on the light-sensitive layer. In the case of conducting imagewise exposure, a polymer image is formed, because the photopolymerizable layer is exposed. However, since the sensitivity of photopolymerization is very low as compared with sensitivity of silver halide of forming the latent image, amount of the polymer formed in this stage can be neglected. Even if a fairly large amount of the polymer is formed, it is not only harmless, but rather preferable, because it reinforces the polymer image obtained by uniform exposure.

In the case of uniformly exposing to light, though the silver halide layer is exposed to light, in general only the latent image is formed. Accordingly, since the phenomenon that the silver image is printed out, and, at the same time, the reducing agent is consumed in an amount corresponding to it does not occur, the polymer image is not fogged.

The polymer imagewise formed as described above can be converted into the final image by carrying out the desired development or visualizing processing according to the purpose of utilization. For example, as be conducted hitherto, in case that the polymer image is used for the use (planographic plates, relief printing plates, resists, reliefs, etc.) which utilizes physical properties thereof (oleophilic water repelling property, mechanical strength, chemical resistance, etc.), the unpolymerized area is dissolved to remove by processing with a liquid (developing solution), which does not dissolve the polymer but does dissolve the layer of the unpolymerized area, or the polymer image and the unpolymerized area can be separated by a dry process utilizing differences in the adhesive property between the polymerized and the unpolymerized area, after a sheet such as a plastic film is brought in close contact with the layer. When it is desired to utilize the polymer image as a visible image, it is possible to use a process which comprises previously coloring the photopolymerizable layer with a pigment or dye, and developing it by dissolution or by separation as described above, or a process which comprises selectively coloring with a colored powder by utilizing the adhesive property of the unpolymerized area, or selectively dyeing the unpolymerized area with a dye solution by utilizing differences in the liquid permeability between the polymerized area and the unpolymerized area.

Further, as a process for visualizing the polymer image, it is possible to use a process which comprises uniformly heating a two component type heat-sensitive material wherein two components thereof are arranged so as to be isolated each other by a photopolymerizable layer, after conducting polymerization, whereby the heat-sensitive components in the polymerized area do not colour, because the polymer functions as a carrier by which they are difficult to move, while they react with each other to cause coloration in the unpolymerized area because of movement thereof, as described in Japanese Patent Application (OPI) No. 89915/77. Furthermore, it is possible to use a process which comprises uniformly pressing a two component type heat-sensitive (pressure-sensitive) material wherein a photopolymerizable composition is dispersed as microcapsules and two components are arranged separately so as to be in the inside and the outside of the capsules and microcapsules at polymerized area are ruptured by uniform pressing to cause coloration, as described in Japanese Patent Applications (OPI) Nos. 179836/82, 197538/82, 23024/83, and 23025/83, corresponding to U.S. Pat. No. 4,501,809, and U.S. Pat. Nos. 4,399,209 and 4,440,846.

Figure 4:
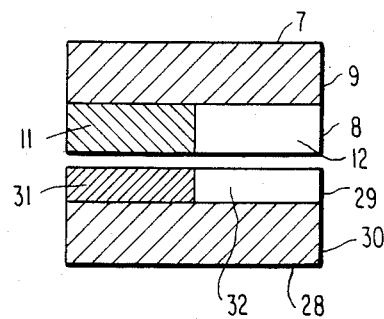
FIG. 4 illustrates an embodiment of the process for converting the polymer image into a visible image.

A particularly suitable process for visualizing the polymer image in order to utilize as a hard copy is that which comprises bleaching a dye by the monomer in the unpolymerized area, particularly, a dye formed by heating a two component type heat-sensitive material (dye precursor) (hereinafter, referred to as "monomer dye bleach process), which has been described in Japanese Patent Application (OPI) 120354/85. For example, when a layer having a polymer image and a monomer image of the reversal image thereof is brought in close contact with a heat-sensitive color forming layer, the heat-sensitive material initially colors the whole face thereof. However, in the area where the monomer image is present, the monomer diffuses into the colored layer to imagewise bleach the dye, whereby a dye image remains in the part corresponding to the polymer image. If the heat-sensitive material is previously developed by heating, following by bringing in close contact, the same result can be obtained. This step is shown in FIG. 4. 7 in the FIG. 4 is a photopolymerizable material wherein the polymer is imagewise formed (in the case of using image recording materials shown in FIG. 2 and FIG. 3, it shows the sheet in the state that polymer is imagewise formed on the image recording material, namely, the state of (C) in FIG. 2 or 3), which comprises a polymer image 11 and a monomer image 12 of the reversal image thereof. When it is heated in close contact with a heat-sensitive material 28 comprising a support 30 having provided thereon a heat-sensitive layer 29 containing two component type heat-sensitive color forming substances, the heat-sensitive material is firstly developed to form a dye on the whole face thereof. However, the monomer 12 diffuses into the heat-sensitive layer to bleach the dye in the area 32, while the dye image 31 remains in the part corresponding to the polymer image because the dye is not bleached.

This process has excellent characteristics such as that, for example, the polymer image can be converted into a dye image having a suitable color hue simply by heating for a short period of time, gradation of the polymer image can be exactly reproduced in the dye image because quantity of the dye bleached is proportionate to quantity of the monomer, the ratio S/N (signal/noise) is high, and the image is fixed to both light and heat simultaneously with formation of the dye image.

Details of the monomer dye bleach process have been described in the above described patent specifications of Japanese Patent Application (OPI) No. 120354/85.

If this process is used for visualizing the polymer image, the whole sequence of steps in the image recording process of the present invention can be conducted using only completely dry processings, within a short time period.

The above described image recordings illustrate cases of using negative type silver halide, wherein both the polymer image and the dye image obtained by the monomer dye bleach process show a negative-positive response to imagewise exposure. On the other hand, direct positive type silver halide can also be used. In such a case, both of the polymer image and the dye image show a positive-positive response.

In the present invention, it is possible to provide an undercoating layer, an antihalation layer, and an antistation layer, which are known in the field of silver halide photography, on the surface or the back of the support, to provide a protective layer on the surface of the light-sensitive layer, and to provide, if desired, an intermediate layer between two layers in the case of the multi-layer mono-sheet type recording materials, and to provide two or more light-sensitive layers to be superposed in layers.

As light-sensitive silver halides used in the present invention, those produced by known processes can be used, such as silver chloride, silver chlorobromide, silver chloroiodide, silver bromide, silver iodobromide, silver chloroiodobromide and silver iodide, etc. Particle size of silver halide is in a range of a diameter of from 0.001 μm to 2 μm, which is measured by a particle size measurement utilizing light scattering or microscope. The silver halide can be chamically sensitized with a chemical sensitizer such as sulfur, selenium, tellurium, gold, platinum, palladium, rhodium, or iridium, or a reducing agent such as tin halide, etc. Further, dye sensitization may be carried out by known processes. Details of these processes have been described in Mees & James *The Theory of the Photographic Process*, The Macmillan Co., 1966, etc.

The above described dye sensitization is useful for increasing sensitivity of the light-sensitive silver halide or selection of the light-sensitive wavelength region.

Dyes that can be used include methine dyes, cyanine dyes, merocyanine dyes, complex cyanine dyes, complex merocyanine dyes, holopolar cyanine dyes, hemicyanine dyes, styryl dyes and hemioxonol dyes. Particularly useful dyes are those belonging to cyanine dyes, merocyanine dyes, and complex merocyanine dyes. In these dyes, any of nuclei conventionally used in cyanine dyes can be applied as basic heterocyclic nuclei. Namely, it is possible to apply a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, etc.; those in which these nuclei are fused with an alicyclic hydrocarbon ring, and those in which these nuclei are fused with an aromatic hydrocarbon ring, i.e., an indolenine nucleus, a benzindolenine nucleus, an indole nucleus, a benzoxazole nucleus, a naphthoxazole nucleus, a benzothiazole nucleus, a naphthothiazole nucleus, a benzoselenazole nucleus, a benzimidazole nucleus, a quinoline nucleus, etc. These nuclei may have substituents on the carbon atoms thereof.

In the merocyanine dyes or complex merocyanine dyes, it is possible to apply 5- or 6-membered heterocyclic nuclei such as a pyrazolin-5-one nucleus, a thiodyantoin nucleus, a 2-thioxazolidine-2,4-dione nucleus, a thiazolidine-2,4-dione nucleus, a rhodanine nucleus, a thiobarbituric acid nucleus, etc., as ketomethylene structure-containing nuclei.

These sensitizing dyes may be used alone or in combination. Combination of sensitizing dyes is often used for the purpose of supersensitization.

A dye which does not itself have a spectrally sensitizing effect or a substance which substantially does not absorb visible light and which shows a supersensitizing effect may be incorporated in the emulsion together with the sensitizing dye. For example, the emulsion may contain aminostyryl compounds (those described, for example, in U.S. Pat. Nos. 2,933,390 and 3,635,721), aromatic organic acid-formaldehyde condensates (for example, those described in U.S. Pat. No. 3,743,510), cadmium salts, azaindene compounds, etc. Combinations described in U.S. Pat. Nos. 3,615,613, 3,615,641, 3,617,295, and 3,635,721 are particularly useful.

In the present invention, it is possible to use organic silver salt oxidizing agents for the purpose of oxidizing the reducing agent in the exposed area by heating, together with light-sensitive silver halide. They are silver salts comparatively stable to light, which oxidize the reducing agent and are reduced themselves into silver when heated in a presence of silver halide having a latent image. Examples thereof include silver salts of aliphatic acids (behenic acid, stearic acid, lauric acid, maleic acid, adipic acid, etc.), aromatic carboxylic acids (benzoic acid, phthalic acid, terephthalic acid, salicyclic acid, etc.), mercapto- or thione group containing compounds (3-mercapto-4-phenyl-1,2,4-thiazole, 2-mercaptobenzimidazole, etc.), imino group containing compounds (benzotriazole or derivatives thereof as described in Japanese Patent Publication Nos. 30270/69, corresponding to British Pat. Nos. 1,173,426, and 18416/70, corresponding to U.S. Pat. No. 3,635,719, etc.), etc.

Polymerizable vinyl monomers to be used in the present invention refers to compounds which have at least one vinyl group or vinylidene group and which can undergo radical polymerization. As such monomers, known acrylic and methacrylic esters, metal salts of acrylic acid (for example, barium acrylate, calcium acrylate, etc.), acrylamide, N,N-methylenebisacrylamide, vinyl ethers, N-vinyl compounds (for example, N-vinylcarbazole), vinyl acetate, etc. can be used. Of these, acrylic and methacrylic esters are particularly preferred in the present invention. In the following, examples thereof are described with respect to acrylic esters. (Specific examples of compounds formed by replacing one or all of acryloyl groups of the acrylic esters by methacryloyl groups, that is, acrylic acid-methacrylic acid mixed esters and methacrylic esters, are omitted, but they can also be used in the present invention similar to the acrylic esters.

Examples include monoacrylates such as methyl acrylate, ethyl acrylate, butyl acrylate, etc., diacrylates such as polyethylene glycol diacrylate, polypropylene glycol diacrylate, hexanediol diacrylate, glycerine diacrylate, trimethylolpropane diacrylate, pentaerythritol diacrylate, etc., tri- and tetra-acrylates such as trimethylolpropane triacrylate, pentaerythritol triacrylate, pentaerythritol tetraacrylate, etc.; and the following polymerizable prepolymers, for example, oligomers formed by reacting the hydroxy residue of a polyester produced by condensation between a polybasic acid (for example, phthalic acid, isophthalic acid, terephthalic acid, maleic acid, fumaric acid, malonic acid, succinic acid, adipic acid, etc.) and a polyhydric alcohol (for example, ethylene glycol, propylene glycol, polyethylene glycol, polypropylene glycol, glycerine, trimethylolpropane, trimethylolethane, pentaerythritol, etc.) with acrylic acid, namely, polyester acrylates (or oligoester acrylates) as described in Japanese Patent Publication No. 7361/77, polyurethane acrylates obtained by reaction between a hydroxyl group containing acrylic ester and an isocyanate as described in Japanese Patent Publication No. 41708/73, epoxyacrylates, etc.

Additionally, two or more monomers may be used in the present invention.

As the photopolymerization initiators used in the present invention, there are illustrated, for example, carbonyl compounds (for example, ketones such as acetophenone, benzoins, benzyl, diacetyl, benzophenone, etc., and quinones such as anthraquinones, naphthoquinones, phenanthrenequinones, etc.) as described in Oster et al. *Chemical Review,* Vol. 68, pp. 125–151 (1968), and Kosar, *Light-Sensitive Systems,* John Wiley & Sons, 1965, pp. 158–193, organic sulfur compounds, peroxides, halogen compounds, photo-semiconductors (for example, zinc oxide, titanium dioxide, etc.), metal ions (for example, iron (I) ion, metal carbonyls, metal complexes, uranyl salts, etc.), silver halides, azo and diazo compounds, photo-reducible dyes, etc.

The photopolymerization initiator using the photo-reducible dyes generally comprise a photo-reducible dye and a hydrogen donating compound, which is believed to produce radicals capable of initiating polymerization upon reaction between the light-excited dye and the hydrogen donating compound. Photo-reducible dyes include Methylene Blue, Thionine, Rose Bengale, Erythrosine B, Eosine, Rhodamine, Phloxine B, Safranine, acriflavine, riboflavine, fluoresceine, uranine, benzoflavine, N,N',N'-tetra-n-butylthionine, N,N,N',N'-tetramethyl-4'-dodecylsafranine, Acridine Orange, Acridine Yellow, 9,10-phenanthrenequinone, benzanthrone or like carbonyl compounds, etc. Examples of hydrogen donating compounds include $\beta$-diketones such as dimedone (1,1-dimethylcyclohexane-3,5-dione, acetylacetone, etc.), amines such as triethanolamine, diethanolamine, monoethanolamine, dimethylamine, diethylamine, tetramethylethylenediamine, triethylamine, phenylhydrazine, etc.; sulfinic acids such as p-toluenesulfinic acid, benzenesulfinic acid, p-(N-acetylamino)benzenesulfinic acid, etc. and salts thereof, N-phenylglycine, L-ascorbic acid, thiourea, allylthiourea, etc. The molar ratio of the photo-reducible dye to the hydrogen donating compound is in a range of from 0.005 to 3 mols, and more preferably from 0.05 to 1 mol of the photo-reducible dye per mol of the hydrogen donating compound. In the case of using a carbonyl compound such as 9,10-phenanthrenequinone as the photo-reducible dye, hydrogen donating compounds need not be used, because the binder functions as a hydrogen donating compound.

Reducing agents used in the present invention are compounds which have a function of the developing agent for silver halide (and organic silver salt oxidizing agents) together with a function of the radical polymerization inhibitor, but lose the function of inhibiting the radical polymerization after they are oxidized by development, as described above, which can be used by selecting those having a desired polymerization inhibiting function from developing agents used for development of conventional silver halide light-sensitive materials. Specified examples of preferred reducing agents include polyhydroxybenzenes such as hydroquinone, catechol, p-tert-butylcatechol, pyrogallol, chlorohydroquinone, p-methoxyphenol, etc., alkoxyphenols, 1-phenyl-3-pyrazolidone and derivatives thereof, aromatic amines such as p-aminophenol, p-N-methylaminophenol, 2,4-diaminophenol, N-(4-hydroxyphenyl)glycine, p-phenylenediamine, methylaniline, N,N-dimethyl-p-phenylenediamine, N,N-diethyl-p-phenylenediamine, etc. Two or more reducing agents may be used at the same time. The combination of 1-phenyl-3-pyrazolidone and hydroquinone is particularly preferred in case of showing superadditivity.

In the present invention, developing accelerators can be used in addition to the reducing agents.

Development accelerators are compounds having a function of accelerating development of silver halide, namely, increasing the amount and the oxidation rate of the reducing agent to be oxidized by a given amount of silver halide. Primary, secondary and tertiary aliphatic amines are suitably used therefor. Specific examples of them include triethanolamine, diethanolamine, monoethanolamine, triethylenediamine, etc. In addition, amines described in Japanese Patent Application (OPI) No. 169143/83 can be used.

The light-sensitive silver halide and/or the photopolymerizable composition of the present invention are generally dispersed in a binder and provided on a support so as to form a layer.

As binders, water soluble polymers such as gelatin, polyvinyl alcohol, polyvinylpyrrolidone, carboxymethyl cellulose, gum arabic, casein, methyl cellulose, etc. and polymers soluble in organic solvents, such as polymethyl methacrylate, polyvinyl chloride, vinylidene chloride-vinylchloride copolymer, vinylidene chloride-acrylonitrile copolymer, polyvinyl acetate, vinyl acetate-vinyl chloride copolymer, styrene-acrylonitrile copolymer, polyester, ABS resin, polyamide, chlorinated polyethylene, chlorinated polypropylene, polyvinyl butyral, polyvinyl formal, acetyl cellulose, etc., are used. As solvents used for dissolving and applying them, water, acetone, toluene, methylene chloride, methylene dichloride, chloroform, methyl ethyl ketone, ethyl acetate, methyl acetate, dimethylformamide, dimethylsulfoxide, etc., are used. Of these binders, it is particularly preferred to use gelatin as a silver halide emulsion for the layer wherein light-sensitive silver halide is dispersed. Binders used for the layer containing the photopolymerizable composition vary depending upon use of the polymer image. In the case of using the polymer image as a printing plate, a resist or a relief by developing with a liquid to remove the unpolymerized area by dissolution, the suitable binder can be selected according to the kind of the developing solution. Further, in case of utilizing the polymer image by visualizing by the monomer dye bleach process, etc., the binder is not particularly restricted, but it is generally preferred to use polymers having low oxygen permeability, for example, polyvinyl alcohol or gelatin, in order to prevent inhibiting or retarding of the polymerization reaction caused by oxygen in the air. Such water soluble polymers are advantageous because of being inexpensive, harmless, and easily handled, and because application can be carried out using water as the solvent.

In the layer containing the photopolymerizable composition, the polymerizable vinyl monomer may be uniformly (molecularly) dispersed in the binder. In this case, the monomer can be applied by dissolving in a common solvent for the binder. However, it is preferred to heterogeneously disperse the monomer as grains in the binder-continuous phase, because it is thus less subjected to the influence of oxygen in the air. Particularly, in the case of using a polymer having a low oxygen permeability as the binder, the polymerization-inhibiting effect of oxygen is excellent.

In such case, the monomer is preferred to be emulsified in a solution of the water soluble binder to produce an emulsion or dispersed as microcapsules, since it is generally insoluble in water. The photopolymerization initiator is distributed in the monomer grains or the binder continuous phase according to its solubilities. Even if it is only present in the continuous phase, there is no problem as long as the ratio of the amount of monomer to binder is within a range described later, because photopolymerization is caused.

The dye capable of being bleached with polymerizable vinyl monomers or the dye precursor which forms a dye capable of being bleached with polymerizable vinyl monomers under heating, used in the present invention, can be selected through a simple test as described below. That is, a dye or a dye precursor to be tested is dissolved or dispersed in a 5% aqueous solution of gelatin and is coated on a transparent film so as to result in a dry film thickness of about 5 $\mu$m, followed by drying. Where the sample to be tested is a dye precursor, it is heated at 150° C. for 1 minute to form color. The coated amount of the dye or dye precursor is adjusted so as to provide a transparent optical density of 1.0 to 1.5. Then, a drop (about 0.1 g) of a 30% aqueous solution of polyethylene glycol diacrylate (the number of —O—CH$_2$CH$_2$— groups being optionally selected between 2 and 15) is applied thereto, and the sample is allowed to stand for 1 minute at room temperature. If the dye in the center of the applied drop is bleached to a transparent optical density of 0.1 or less, the dye or dye precursor can be suitably used in the present invention. Generally, those which are bleached to a transparent optical density of more than 0.1 are not preferred.

The dyes and dye precursors suitably used in the present invention are those which are known two-component type color-forming substances (dye precursors) generally used for heat-sensitive or pressure-sensitive materials and dyes obtained by heating them or subjecting them to solution reaction to form a color. The two-component type color forming substance consists of two components, a color former, and a color developer.

Generally, when these two components are brought into contact, they react with each other, even at room temperature, to form a dye. An embodiment wherein the two components are dispersed in a binder in a state of not being in contact with each other yields a dye precursor of the present invention for forming a visible image. In this embodiment, at least one of the two components is melted upon heating, and diffuses to react and form color when it is brought in contact with the other component.

Specific examples of the color formers of the two-component type color forming substances are illustrated below: triphenylmethane lactones (or triphenylmethanephthalides) as described in U.S. Pat. Nos. 2,548,366 and 2,505,472, and Japanese Patent Application (OPI) No. 56224/83 (corresponding to British Patent No. 1,590,915), such as Crystal Violet lactone, Malachite Green lactone, etc.; fluorans as described in Japanese Patent Publication Nos. 18726/74, 18727/74, 4698/70, 4701/70, 29550/71, 4051/73, 4052/73, 4614/71, 8725/73, 8726/73, 10871/77, 23203/76 and 29662/72 and Japanese Patent Application (OPI) 82243/77, such as 3,6-dimethoxyfluoran, 2-methyl-6-isopropylaminofluoran, 2-bromo-3-chloro-6-n-propylamino-7-bromofluoran, 3-diethylamino-7-dibenzylaminofluoran, 3-dimethylamino-7-methylaminofluoran, 4,5,6,7-tetrachloro-1',2',3'-trimethyl-6'-diethylaminofluoran, 3-diethylamino-5,6-benzofluoran, 3-diethylamino-7,8-benzofluoran, 2-N-ethyl-N-phenylamino-6-diethylaminofluoran, 2-N-phenylamino-3-methyl-6-diethylaminofluoran, 2-N-phenylamino-3-methyl-6-N-ethyl-N-(p-tolyl)aminofluoran, 3-diethylamino-7-phenylfluoran, 3',6'-bis(N-methyl-N-phenylamino)-4,5,6,7-tetrachlorofluoran, 2-ethoxyethylamino-3-chloro-6-diethylaminofluoran, etc.; azaphthalides and diazaphthalides as described in Japanese Patent Publication Nos. 8727/73, 8728/73, 8729/73, 8730/73, and 18725/73, such as 3-(4'-diethylaminophenyl)-3-(4'-dimethylamino-2'-chlorophenyl)-7-azaphthalide, 3,3-bis(4'-dimethylaminophenyl)-4,7-diazaphthalide, etc.; fluoran-γ-lactams (rhodamine lactams) as described in Japanese Patent Publication Nos. 29662/72 and 103710/74; phenothiazines as described in Japanese Patent Application (OPI) Nos. 45319/73 and 34427/72, such as Benzoyl leuco Methylene Blue; indolylphthalides as described in Japanese Patent Application (OPI) No. 46010/72 and British Patent No. 1,160,940; spiropyrans as described in Japanese Patent Publication Nos. 14873/61 and 10783/72 and Japanese Patent Application (OPI) No. 95420/73; triphenylmethanes as described in Japanese Patent Publication No. 16052/71 and Japanese Patent Applications (OPI) Nos. 92207/76 and 161637/79; chromenoindoles as described in Japanese Patent Applications (OPI) 148099/77 and 125114/79; and compounds as described in Japanese Patent Application (OPI) Nos. 124930/75, 111528/79, 84238/77, 90255/78, 29552/71, 121035/76, and 121035/76, and Japanese Patent Publication Nos. 12317/71, 2530/71, 7473/80, 25654/70, 29552/71, 25654/70, and 5929/74.

Of these color formers, those which provide dyes with the desired color and weatherability are selected for use in the present invention. Two or more color formers may be used at the same time.

Examples of color developers of the two-component type color forming substances include phenol compounds (for example, bisphenol A, bisphenol B, 2,2-bis(4-hydroxyphenyl)-n-heptane, 1,1-bis(4-hydroxyphenyl)cyclohexane, 2-ethyl-1,1'-bis(4-hydroxyphenyl)hexane or like bisphenol A's and phenols such as 4-phenylphenol), organic acids and anhydrides or salts thereof (for example, salicylic acid derivatives and zinc salt thereof, citric acid, tartaric acid, succinic acid, maleic acid, phthalic acid, phthalic acid anhydride, tetrachlorophthalic acid anhydride, p-toluenesulfonic acid and sodium salt thereof), inorganic salts (for example, aluminium sulfate, potassium alum, and ammonium alum), acid clay, activated clay, kaolin, zeolite, etc. Of these, bisphenols are particularly preferred from the view points of the density of formed color, color-forming rate, etc.

These dyes or dye precursors are generally dispersed in a binder and provided on a support so as to form a layer. As the binders, those which are used for dispersing light-sensitive silver halide or the photopolymerizable composition as described above are used. In case of using the dyes, the polymer and the solvent are not restricted. However, in case of using the dye precursors, a water soluble polymer is generally used as a binder and water is advantageously used for coating, because the use of an organic solvent can cause dissolution of the color former or color developer, followed by immediate coloration.

In the present invention, it is preferred to add a thermal solvent to the silver halide layer and/or the photopolymerizable layer in order to accelerate thermal development of silver halide or transfer of the reducing agent into the photopolymerizable layer. Ther thermal solvent is the compound having a melting point in a temperature range of carrying out thermal development or transfer, for example, from 80° C. to 200° C., which dissolve the reducing agent in a melted state to accelerate movement thereof and which does not react with the silver halide, the reducing agent and the photopolymerizable composition. Specific examples of the thermal solvents include sorbitol, pentaerithritol, trimethylolpropane, trimethylolethane, hexanediol, cyclohexanediol, saponin and like polyhydroxy compounds, urea, dimethylurea, methylurea, acetamide, N-methylacetamide, etc.

In addition, known preservatives and antifoggants can be added to the layer containing light-sensitive silver halide of the present invention.

As the supports, paper, resin-coated paper, plastic films such as polyethylene terephthalate or triacetyl cellulose films, aluminum plate, etc., can be used, selecting according to the particular purpose of use.

In the following, amounts of the above described substances to be used in the present invention are described.

The light-sensitive silver halide is preferably used in a silver content range of from 0.005 g to 1 g/m$^2$, and more preferably from 0.01 g to 0.3 g/m$^2$.

The organic silver salt oxidizing agent is preferably used in a range of from 0 to 20 mols, and more preferably from 0 to 10 mols, per mol of silver halide.

The polymerizable vinyl monomer is preferably used in a range of from 0.1 g to 10 g/m$^2$, and more preferably from 0.5 to 5 g/m$^2$.

In any of the light-sensitive silver halide layer, the photopolymerizable layer and the single layer monosheet type recording material, the amount of the binder is generally in a range of from 0.1 g to 10 g/m$^2$, and preferably from 0.3 g to 5 g/m$^2$. The photopolymerization initiator is used in a range of 0.0001 mols to 0.1 mols, preferably 0.001 mols to 0.05 mols, per mol of the polymerizable vinyl monomer. The reducing agent should be reduced to such an amount that it is oxidized with silver halide in the area where sufficient exposure is applied (highlight part) whereby polymerization is not substantially inhibited. The amount of the reducing agent varies depending upon an ability thereof for preventing polymerization. Generally, the amount of the reducing agent is in a range of from 0.01 mols to 5 mols, and preferably from 0.05 mols to 1 mol, per mol of light-sensitive silver halide (the total amount of silver compounds in the case of using an organic silver salt oxidizing agent). The amount of the development accelerator is generally in a range of from 0 mol to 10 mols, and preferably 0 mol to 5 mols, per mol of the reducing agent.

The amount of the dye used for the monomer dye bleach process or the dye or color former in the heat-sensitive color forming layer is generally in a range of from 0.05 g to 10 g/m$^2$, and preferably from 0.1 g to 5 g/m$^2$. However, the amount of the dye or color former can be controlled according to the amount of the monomer contained in the unpolymerized area so that the dye is completely bleached with the monomer transferred from the photopolymerizable layer. The amount of the color developer is in a range of from 0.1 mols to 10 mols, and preferably from 0.5 mols to 5 mols, per mol of the color former. The amount of the thermal solvent is generally in a range of from 0 g to 5 g, and preferably from 0 g to 2 g, per g of the binder. The film thickness of the layer containing light-sensitive silver halide is generally in a range of from 0.03 μm to 5 μm, and preferably from 0.1 μm to 2 μm, and that of the photopolymerizable layer is generally in a range of 0.5 μm to 20 μm, and preferably from 1 μm to 10 μm. In the case of single layer mono-sheet type recording materials, the film thickness of the recording layer is equal to that of the photopolymerizable layer. The film thickness of the dye or heat-sensitive color forming layer is generally in a range of from 0.1 μm to 20 μm, and preferably from 0.5 μm to 10 μm.

Imagewise exposure is conducted using the light which contains wavelengths to which the light-sensitive silver halide (including those which are spectrally sensitized) responds, and uniform exposure is conducted using the light which contains wavelengths to which the photopolymerization initiator responds. As light sources, tungsten lamps, halogen lamps, mercury lamps, fluorescent lamps, xenon lamps, laser, LED, CRT, etc., are generally used, and exposure can be carried out with visible light or ultraviolet light thereof. Further, imagewise exposure can be conducted using X-rays. The amount of first exposure to silver halide varies depending upon sensitivity of silver halide, but it is generally in a range of $10^{-2}$ to $10^4$ cms. The amount of uniform exposure of forming a polymer image is generally in a range of $10^3$ to $10^8$ erg/cm$^2$, and preferably from $10^4$ to $10^6$ erg/cm$^2$.

Heating can be conducted using a hot plate, a heat roller, an infrared heater, or the like. The temperature of heating is generally in a range of from 80° C. to 200° C., and preferably from 100° C. to 130° C. The time of heating is generally in a range of from 1 second to 100 seconds, and preferably from 5 seconds to 20 seconds. The temperature and the time of heating as described above are in the same ranges in any case of development of silver halide, transfer of the reducing agent to the photopolymerizable layer and monomer dye bleaching.

Development of the latent image formed in silver halide is preferred to carry out by the process which comprises heating in a presence of the reducing agent, because of using a simple apparatus. However, it can be carried out by aqueous development.

In the case that the recording material contains the reducing agent together with the light-sensitive silver halide as described above, the aqueous development can be conducted simply by immersing it in water having a pH of 3 to 12. Further, in case that the light-sensitive silver halide layer and the photopolymerizable layer are provided on different supports, respectively, the reducing agent remaining in the light-sensitive silver halide layer can be transferred to the photopolymerizable layer simply by bringing the wet light-sensitive silver halide layer after subjected to aqueous development in contact with the photopolymerizable layer.

When the recording material does not contain the reducing agent, the recording material can be developed with water containing the reducing agent. In this case, it is necessary to control concentration of the aqueous solution containing the reducing agent and amount of the aqueous solution coated on the recording material so that the reducing agent is added to the recording material in a required amount. In case that the light-sensitive silver halide layer and the photopolymerizable layer are provided on different supports, respectively, the reducing agent remaining in the light-sensitive silver halide layer can be transferred to the photopolymerizable layer by bringing the wet light-sensitive silver halide layer after being subjected to aqueous development into contact with the photopolymerizable layer.

In order to form a polymer image according to the image recording process of the present invention, the following processes can be conducted depending upon the structure of the recording material.

(1) In the case of the recording material wherein the light-sensitive silver halide layer and the photopolymerizable layer are provided on different supports, respectively, the polymer image is formed according to the following order.

(a) The recording material having a light-sensitive silver halide layer is imagewise exposed to light to form a latent image.

(b) In the case that the light-sensitive silver halide layer contains a reducing agent, thermal development or aqueous development is conducted, and, in the case that it does not contain the reducing agent, the development is conducted with an aqueous solution containing a reducing agent.

(c) The developed light-sensitive silver halide layer and the photopolymerizable layer are brought in contact with each other, or they are heated after brought in contact with each other, to transfer the reducing agent remaining in the light-sensitive silver halide layer to the photopolymerizable layer.

(d) The photopolymerizable layer is substantially uniformly exposed to light in a state that it is in contact with the light-sensitive silver halide layer or after separating it from the light-sensitive silver halide to form a polymer image in the photopolymerizable layer.

In conducting the steps (b) and (c), the development and the transfer can be carried out at the same time by heating the light-sensitive silver halide layer and the photopolymerizable layer in contact with each other or by spreading a layer of water between both layers.

(2) In the case of recording material wherein the light-sensitive silver halide layer and the photopolymerizable layer are provided on the same support or the recording material containing the light-sensitive silver halide and the photopolymerizable substance in the same layer, the polymer image is formed according to the following order.

(a) The recording material is imagewise exposed to light to form a latent image.

(b) In the case that the recording material contains the reducing agent, thermal development or aqueous development is conducted, and, in the case that the recording material does not contain the reducing agent, it is developed with an aqueous solution containing the reducing agent.

(c) The recording material is substantially uniformly exposed to light to form a polymer image in it.

The image recording process and the materials of the present invention can be utilized for various uses. In case of using for printing plates, photoresists, reliefs, etc., recording can be carried out with light of suitable wavelengths (ultraviolet light, visible light of blue-red)

at a higher sensitivity than that of the prior photopolymerizable material or photopolymer.

Further, it can be used for various hard copies (use of utilizing as a visible image) and it is possible to record an image having suitable color simply by a dry processing with a suitable wavelength at a higher sensitivity than that of the prior photopolymerizable materials or other non-silver salt light-sensitive materials. Moreover, in any of the above described uses, the image can be recorded at a sensitivity equal to that of the prior silver salt photographic materials using a very smaller amount of silver, as shown in the examples below.

EXAMPLE 1

(Preparation of silver halide light-sensitive material)
  Silver chlorobromide emulsion (containing 10% by weight of silver chlorobromide of a molar ratio of chlorine/bromine of 1/1): 1.5 g
  10 wt% aqueous solution of gelatine: 2.2 g
  Phenidone: 0.1 g
  Triethanolamine: 0.1 g
  Sorbitol: 0.2 g
  5-wt% aqueous solution of sodium p-dodecylbenzenesulfonate: 0.15 g
  Water: 36.0 g
A solution of the above described formulation was applied to a polyethylene terephthalate film so as to result in a dry film thickness of 1 $\mu$m, and dried to prepare a silver halide light-sensitive material. The amount of silver halide coated was 0.05 g/m$^2$ as silver.

(Preparation of photopolymerizable material)
  Pentaerythritol tetraacrylate: 2 g
  Methylene Blue: 0.007 g
  Dimedone (1,1-dimethylcyclohexane-3,4-dione): 0.2 g
  Sorbitol: 0.5 g
  10 wt% aqueous solution of polyvinyl alcohol (average degree of polymerization: about 500): 10 g
  5 wt% aqueous solution of sodium p-dodecylbenzenesulfonate: 0.5 g
A mixture of the above described formulation was emulsified by a ultrasonic emulsifier for 1 hour, and it was applied to a polyethylene terephthalate film so as to result in a dry film thickness of about 7 $\mu$m, and dried to prepare a photopolymerizable material.

(Preparation of heat-sensitive color forming material)
  5 g of a dispersion obtained by dispersing a mixture of the following formulation in a homogenizer for 1 hour together with glass beads:
    2-Ethoxyethylamino-3-chloro-6-diethylamino fluoran: 10 g
    10 wt% aqueous solution of gelatin: 10 g
    5 wt% aqueous solution of sodium p-dodecylbenzenesulfonate: 0.2 g
    Water: 40 g
was uniformly mixed with 10 g of a mixture obtained by dispersing a mixture of the following formulation in a homogenizer for 1 hour together with glass beads:
    2-Ethyl-1,1'-bis(4-hydroxyphenyl)hexane: 10 g
    10 wt% aqueous solution of gelatin: 10 g
    5 wt% aqueous solution of sodium p-dodecylbenzenesulfonate: 0.2 g
    Water: 40 g
and the mixture was applied to a polyethylene terephthalate film so as to result in a dry film thickness of 2 $\mu$m and dried to prepare a heat-sensitive color forming material.

(Image recording)

The silver halide light-sensitive material was exposed through a step wedge using a halogen lamp at 100 lux. sec. When it was allowed to pass through a heat roller heated to 110° C. (heating time was about 15 seconds), a very thin silver image was formed by development.

Then, it was brought into close contact with the photopolymerizable layer. After they were allowed to pass through a heat roller by the same manner as described above, they were uniformly exposed for 30 seconds using a halogen lamp at 50,000 luxes. These two materials were separated and the photopolymerizable material was brought into close contact with the heat-sensitive color forming material. When they were allowed to pass through the above described heat roller (heating time was about 20 seconds), a dye image having black continuous gradation of high density was formed on the area corresponding to the silver image. Fog was not caused in the unexposed area of imagewise exposure.

EXAMPLE 2

A photopolymerizable material and a silver halide light-sensitive material were prepared in the same manner as in Example 1, except that 0.1 g of phthalocyanine was added as a coloring agent to disperse in a coating solution for the photopolymerizable material. Imagewise exposure of the silver halide light-sensitive material, heating it in contact with the photopolymerizable material and uniform exposure thereof were conducted by the same manner as in Example 1. After two materials were separated, the photopolymerizable material was immersed in a developing solution composed of 1 part of ethanol and 1 part of water for 30 seconds to remove unpolymerized part, whereby a blue image having high density which hardly had gradation was formed in the area corresponding to the silver image.

EXAMPLE 3

When the same procedures as in Example 1 were conducted, except that development of silver halide and transfer of the unreacting reducing agent to the photopolymerizable layer were carried out at the same time by allowing to pass through a heat roller heated to 110° C. (heating time was about 15 seconds) after exposing the light-sensitive material and subsequently bringing the silver halide light-sensitive material into contact with the photopolymerizable material, nearly the same results were obtained.

EXAMPLE 4

A silver halide light-sensitive material was prepared in the same manner as in Example 1, and a coating solution used for the photopolymerizable material in Example 1 was applied thereto so as to result in the same thickness to prepare a multilayer monosheet type image recording material. After it was imagewise exposed, it was brought in close contact with a polyethylene terephthalate film and heated for 15 seconds by touching with a hot plate heated to 110° C. Then, uniform exposure was conducted at room temperature for 30 seconds using a halogen lamp at 50,000 luxes. The polyethylene terephthalate film was separated from the recording material. When it was brought into close contact with a heat-sensitive color forming material similarly to Example 1 and allowed to pass through a heat roller heated to 110° C., (heating time was about 20 seconds), an image similar to the case of Example 1 was formed.

While the invention has been described in detail and with reference to specific embodiments thereof, it will be apparent to one skilled in the art that various changes and modifications can be made therein without departing from the spirit and scope thereof.

What is claimed is:

1. An image recording process which comprises forming a latent image by imagewise exposure of light-sensitive silver halide, developing the latent image with a reducing agent selected from the group consisting of polyhydroxybenzenes, alkoxyphenols, 1-phenyl-3-pyrazolidones and aromatic amines which has a function as a developing agent for silver halide and a function as a polymerization inhibitor for polymerizable vinyl monomer, but loses the function as a polymerization inhibitor after development of silver halide, to result in a state that polymerization of the polymerizable vinyl monomer is inhibited by the residual reducing agent, and thereafter conducting substantially uniform light exposure to cause photopolymerzation of the polymerizable vinyl monomer in the part where said reducing agent is not present, in the presence of a photopolymerization initiator, whereby a polymer image corresponding to said latent image is formed.

2. An image recording process which comprises forming a latent image by imagewise exposure of light-sensitive silver halide, developing the latent image with a reducing agent selected from the group consisting of polyhydroxybenzenes, alkoxyphenols, 1-phenyl-3-pyrazolidones and aromatic amines which has a function as a developing agent for silver halide and function as a polymerization inhibitor for polymerizable vinyl monomer, but loses the function as a polymerization inhibitor after development of silver halide, to result in a state that polymerization of the polymerizable vinyl monomer is inhibited by the residual reducing agent, and thereafter conducting substantially uniform light exposure to cause photopolymerization of the polymerization vinyl monomer in the part where said reducing agent is not present, in a presence of a photopolymerization initiator, thereby forming a polymer image, and thereafter substantially uniformly heating the layer having said polymer image and a layer containing a dye capable of being bleached with said polymerizable vinyl monomer, or containing a dye precursor which forms a dye capable of being bleached with said polymerizable vinyl monomer while heating in a state of contact, to bleach said dye or the dye formed from said dye precursor with the unpolymerized polymerizable vinyl monomer, whereby the dye image corresponding to said latent image is formed.

3. An image recording process as in claim 1, wherein the light-sensitive silver halide is used in a silver content range of from 0.005 g to 1 g/m$^2$.

4. An image recording process as in claim 1, wherein the light-sensitive silver halide is used in a silver content range of from 0.01 g to 0.3 g/m$^2$.

5. An image recording process as in claim 1, wherein the polymerizable vinyl monomer is used in a range of from 0.1 g to 10 g/m$^2$.

6. An image recording process as in claim 1, wherein the photopolymerization initiator is contained in a range of from 0.0001 to 0.1 mols per mol of the vinyl monomer.

7. An image recording process as in claim 1, wherein the reducing agent is contained in a range of from 0.01 to 5 mols per mol of the light-sensitive silver halide.

8. An image recording process as in claim 1, wherein an organic silver salt oxidizing agent is additionally contained.

9. An image recording process as in claim 1, wherein the photopolymerization initiator comprises a photoreducible dye and a hydrogen donating compound.

10. An image recording process as in claim 2, wherein an aliphatic amine is additionally added as a developing accelerator.

11. An image recording process as in claim 2, wherein the light-sensitive silver halide is used in a silver content range of from 0.005 g to 1 g/m$^2$.

12. An image recording process as in claim 2, wherein the light-sensitive silver halide is used in a silver content range of from 0.01 g to 0.3 g/m$^2$.

13. An image recording process as in claim 2, wherein the polymerizable vinyl monomer is used in a range of from 0.1 g to 10 g/m$^2$.

14. An image recording process as in claim 2, wherein the polymerizable vinyl monomer is used in a range of from 0.5 g to 5 g/m$^2$.

15. An image recording process as in claim 2, wherein the photopolymerization initiator is contained in a range of from 0.0001 to 0.1 mols per mol of the vinyl monomer.

16. An image recording process as in claim 2, wherein the reducing agent is contained in a range of from 0.01 to 5 mols per mol of the light-sensitive silver halide.

17. An image recording process as in claim 2, wherein an organic silver salt oxidizing agent is additionally contained.

18. An image recording process as in claim 2, wherein the photopolymerization initiator comprises a photoreducible dye and a hydrogen donating compound.

19. An image recording process as in claim 2, wherein an aliphatic amine is additionally added as a developing accelerator.

* * * * *